(12) United States Patent
Oka

(10) Patent No.: US 7,187,317 B2
(45) Date of Patent: Mar. 6, 2007

(54) A/D CONVERSION APPARATUS

(75) Inventor: Yoshitaka Oka, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/253,627

(22) Filed: Oct. 20, 2005

(65) Prior Publication Data

US 2006/0087468 A1    Apr. 27, 2006

(30) Foreign Application Priority Data

Oct. 21, 2004    (JP)    ............... 2004-306478

(51) Int. Cl.
*H03M 1/12*    (2006.01)
(52) U.S. Cl. .................... 341/156; 341/155
(58) Field of Classification Search .............. 341/122, 341/155, 156, 162, 163, 159, 161
See application file for complete search history.

(56) References Cited

U.S. PATENT DOCUMENTS 4,994,806 A * 2/1991 Yun-Tae ................. 341/155
5,455,583 A * 10/1995 Stryjewski ............. 341/156

FOREIGN PATENT DOCUMENTS

JP    5-63571    3/1993

* cited by examiner

*Primary Examiner*—Brian Young
(74) *Attorney, Agent, or Firm*—McGinn IP Law Group, PLLC (57) ABSTRACT

An A/D conversion apparatus for converting an analog signal into a digital signal includes a successive approximation A/D converter receiving the analog signal and outputting high-order data of the digital signal, a flash A/D converter receiving the analog signal and outputting low-order data of the digital signal, and a coupling circuit coupling the high-order data and the low-order data and outputting the digital signal.

20 Claims, 8 Drawing Sheets

RELATED ART

Fig. 8

RELATED ART

A/D CONVERSION APPARATUS

BACKGROUND OF THE INVENTION

1. Field of the Invention

The present invention relates to an A/D conversion apparatus and, particularly, to an A/D conversion apparatus that splits data into high-order bits and low-order bits for conversion.

2. Description of the Related Art

Figure 8:
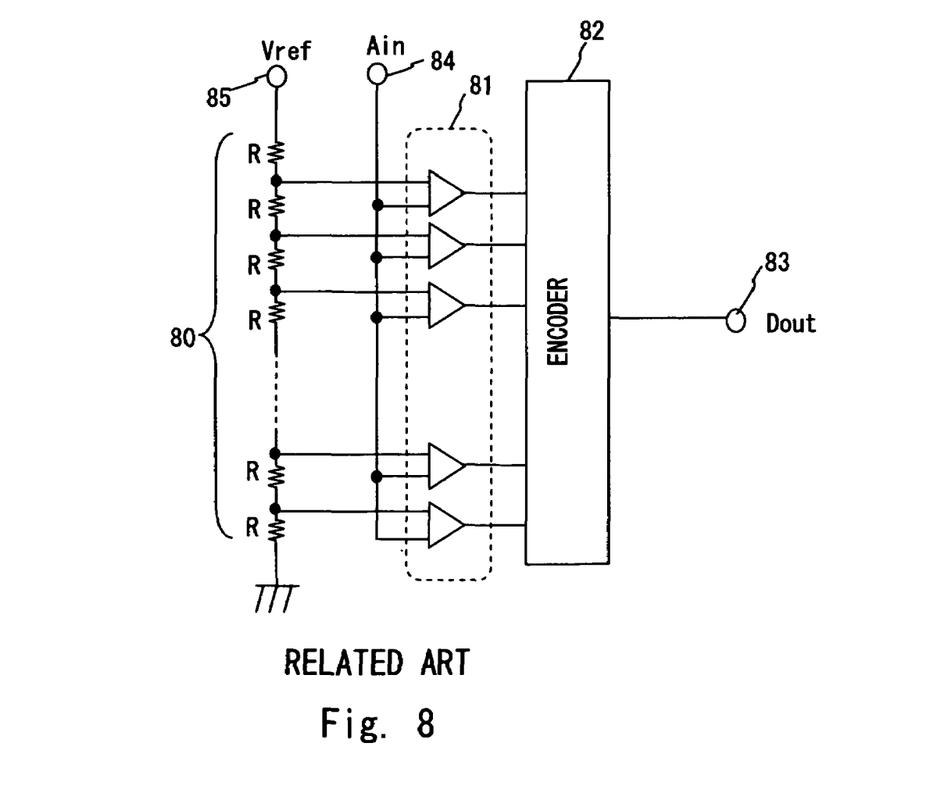
FIG. 8 is a block diagram showing a flash A/D conversion apparatus.

An analog-to-digital (A/D) conversion apparatus samples an analog input signal at a sample/hold circuit and converts the sampled analog input signal to a digital signal at an A/D converter circuit. There are two types of A/D conversion apparatus: successive approximation type and flash type. FIG. 8 is a block diagram that schematically shows a flash A/D conversion apparatus. The flash A/D conversion apparatus includes a voltage dividing resistor array 80, a plurality of comparators 81, and an encoder 82. The output of the encoder 82 is connected to a digital output terminal 83. The input of the encoder 82 is connected to the plurality of comparators 81. One input of each comparator 81 is connected to an analog input terminal 84 and the other input of each comparator 81 is connected to one end of each voltage dividing resistor R. One end of the voltage dividing resistor array 80 as a whole is connected to a reference input voltage terminal 85 and the other end is grounded.

The operation of the flash A/D conversion apparatus is described herein. An analog input voltage Ain from the analog input terminal is supplied to each comparator at a time. The analog input voltage Ain is compared with a reference input voltage that is supplied from the reference input voltage terminal 85 and divided by each voltage dividing resistor R. The encoder 82 encodes an analog input voltage into binary bit-string data based on the output from the comparator 81.

Thus, analog to digital conversion involves voltage comparison at each comparator and encoding to bit-string data at the encoder. Each bit of the bit string is weighted according to a reference voltage.

Figure 9:
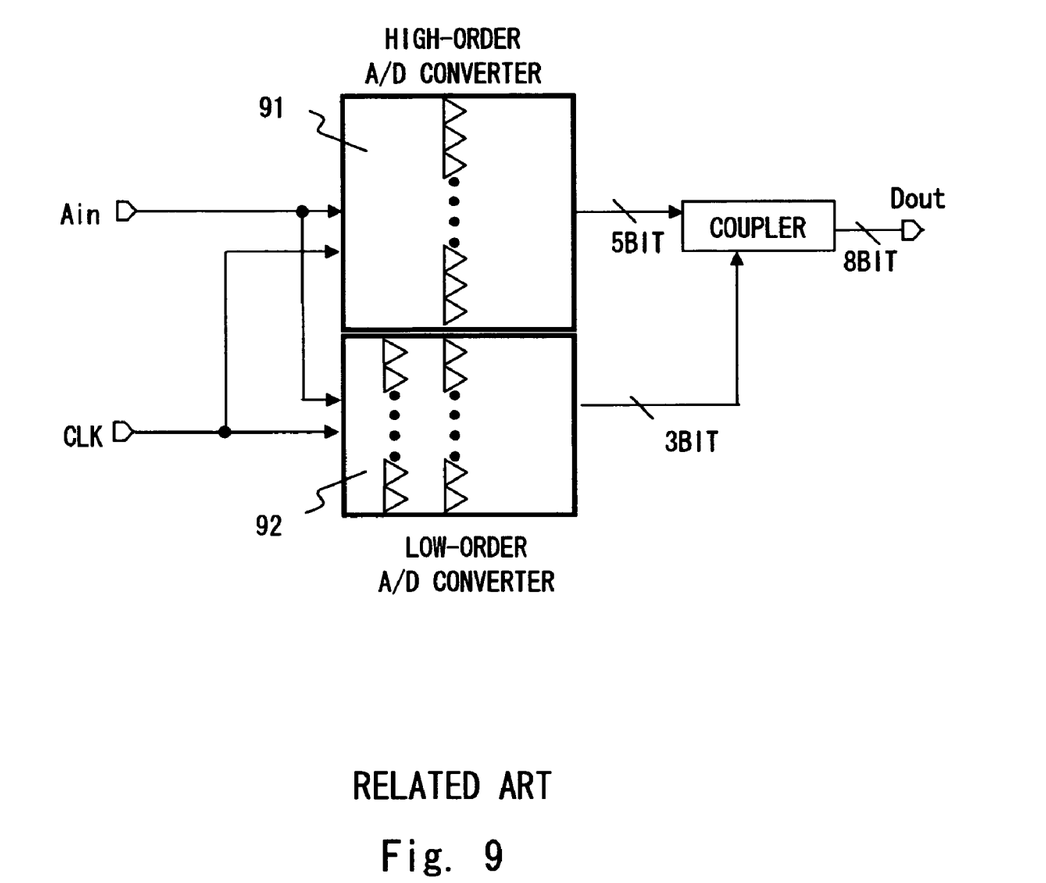
FIG. 9 is a block diagram showing a conventional A/D conversion apparatus.

A conventional A/D conversion apparatus having A/D converters in multiple stages is disclosed in Japanese Unexamined Patent Application Publication No. 5-63571. A conventional A/D conversion apparatus that generates a 8-bit digital signal includes flash A/D converters in two stages so as to use a smaller number of comparators. FIG. 9 shows the A/D conversion apparatus.

In the A/D conversion apparatus shown in FIG. 9, a high-order A/D conversion apparatus 91 converts high-order 5 bits. A low-order A/D conversion apparatus 92 receives a reference voltage based on a conversion result of the high-order 5 bits. After that, the low-order A/D converter 92 converts low-order 3 bits. The output of the high-order A/D conversion apparatus 91 and the output of the low-order A/D conversion apparatus 92 are coupled at a coupler and output as 8-bit digital data Dout.

However, even with the two-stage configuration for high-order bits and low-order bits, the flash A/D conversion apparatus still requires a large number of comparators. Use of a large number of comparators causes large power consumption in the A/D conversion apparatus and large circuit scale.

On the other hand, use of a successive approximation A/D conversion apparatus requires a smaller number of comparators; however, it requires a comparator capable of converting a voltage of ¼ to ⅛ of a voltage per 1LSB (LSB voltage) that is obtained by dividing a full scale input voltage by $2^n$ (n is resolving power). To compare extremely small voltages, the successive approximation A/D conversion apparatus requires a comparator of multistage configuration, which results in large power consumption.

As described above, the present invention has recognized that conventional A/D conversion apparatus require a large amount of power due to a large number of comparators and a high level of accuracy required for comparators, thus incapable of achieving low power consumption.

SUMMARY OF THE INVENTION

According to an aspect of the present invention, there is provided an A/D conversion apparatus for converting an analog signal into a digital signal that includes a successive approximation A/D converter receiving the analog signal and outputting high-order data of the digital signal, a flash A/D converter receiving the analog signal and outputting low-order data of the digital signal, and a coupling circuit coupling the high-order data and the low-order data and outputting the digital signal.

According to another aspect of the present invention, there is provided an A/D conversion method that includes generating high-order data as a result of converting an input analog signal into a digital signal of a first predetermined number of bits by performing successive approximation a plurality of times, generating low-order data as a result of converting the input analog signal into a digital signal of a second predetermined number of bits by comparing in parallel the analog signal with a reference voltage set based on the high-order data, and converting the input analog signal into a digital output signal by coupling the high-order data and the low-order data.

The above A/D conversion apparatus and A/D conversion method can reduce power consumption.

BRIEF DESCRIPTION OF THE DRAWINGS

The above and other objects, advantages and features of the present invention will be more apparent from the following description taken in conjunction with the accompanying drawings, in which.

PREFERRED EMBODIMENT OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
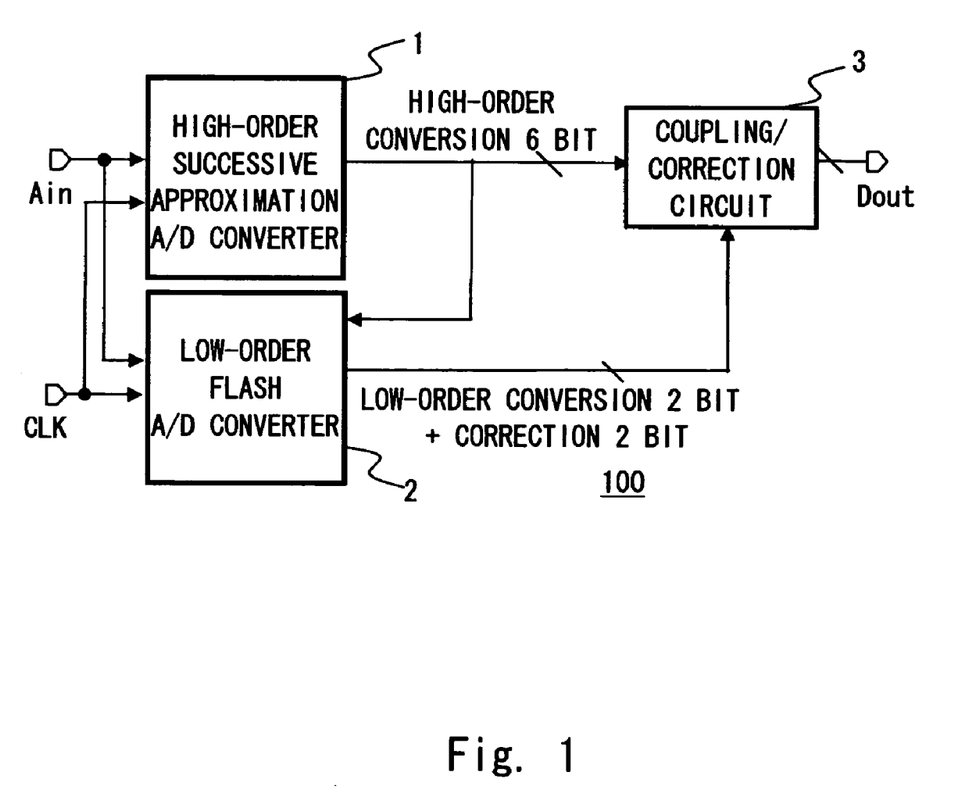
FIG. 1 is a block diagram showing an A/D conversion apparatus of an embodiment of the present invention.

An embodiment of the present invention is described hereinafter with reference to the accompanying drawings. FIG. 1 is a block diagram showing the configuration of an A/D conversion apparatus 100 of an embodiment of the invention. The A/D conversion apparatus 100 of this embodiment converts analog input voltage Ain of an input analog signal into an 8-bit digital output signal Dout and outputs the converted signal. As shown in FIG. 1, the A/D conversion apparatus 100 of this embodiment includes a high-order successive approximation A/D converter 1, a low-order flash A/D converter 2, and a coupling/correction circuit 3.

The high-order successive approximation A/D converter 1 receives an analog input voltage Ain and a clock signal CLK. The high-order successive approximation A/D converter 1 converts the analog input voltage Ain into a digital signal in accordance with an input clock signal CLK. The high-order successive approximation A/D converter 1 outputs high-order 6 bits of the 8 bit digital output signal Dout. In other words, it outputs high-order data corresponding to a first predetermined number of bits.

The low-order flash A/D converter 2 receives an analog input voltage Ain and a clock signal CLK. The low-order flash A/D converter 2 converts the analog input voltage Ain into a digital signal in accordance with an input clock signal CLK. The low-order flash A/D converter 2 outputs low-order 2 bits of the 8 bit digital output signal Dout. In other words, it outputs low-order data corresponding to a second predetermined number of bits.

The low-order flash A/D converter 2 further outputs 2 correction bits in addition to the low-order 2 bits. The correction bits are detailed later.

The coupling/correction circuit 3 receives the outputs of the high-order successive approximation A/D converter 1 and the low-order flash A/D converter 2. The coupling/correction circuit 3 serves as a coupling circuit that couples the high-order 6 bits and the low-order 2 bits. The coupling/correction circuit 3 also serves as a correction circuit that corrects the value of the high-order 6 bits according to correction bits and outputs the corrected data. The output of the coupling/correction circuit 3 is a digital signal Dout to be output from the A/D conversion apparatus 100.

The operation of the A/D conversion apparatus 100 of this embodiment is described schematically below. When an analog input voltage Ain is applied to the A/D conversion apparatus 100, the input voltage Ain is supplied to the high-order successive approximation A/D converter 1 and the low-order flash A/D converter 2. The high-order successive approximation A/D converter 1 compares the input voltage Ain with a voltage corresponding to a most significant bit (MSB) and outputs a comparison result as MSB data. The same operation is repeated successively until high-order data of 6 bits from the highest is output.

The high-order data that is output from the high-order successive approximation A/D converter 1 is supplied to the low-order flash A/D converter 2 and the coupling/correction circuit 3. The low-order flash A/D converter 2 sets a low-order reference voltage based on the input high-order 6 bits. It then compares the input voltage Ain with the reference voltage and outputs low-order data corresponding to low-order 2 bits and 2 correction bits.

The coupling/correction circuit 3 couples the high-order 6 bits (high-order data) and the low-order 2 bits (low-order data) to create 8-bit output data Dout. If correction of the high-order 6 bits is needed, the coupling/correction circuit 3 corrects the high-order 6 bits. The correction is performed according to the correction bits that are output from the low-order flash A/D converter 2. The data coupled and corrected by the coupling/correction circuit 3 is output as output data Dout of the A/D conversion apparatus 100.

In this configuration, it is sufficient for the low-order flash A/D converter 2 to merely convert low-order 2 bits. This prevents the number of comparators of the low-order flash A/D converter 2 from increasing according to the number of bits. The high-order bits are converted by the successive approximation A/D converter. This significantly reduces the number of comparators compared with the case of using the flash A/D converter to create high-order data. Further, it is sufficient for the high-order successive approximation A/D converter to merely perform comparison of voltages from 1st to 6th bits from the highest. This prevents power consumption from increasing due to a complicated configuration such as multistage amplification.

Figure 2:
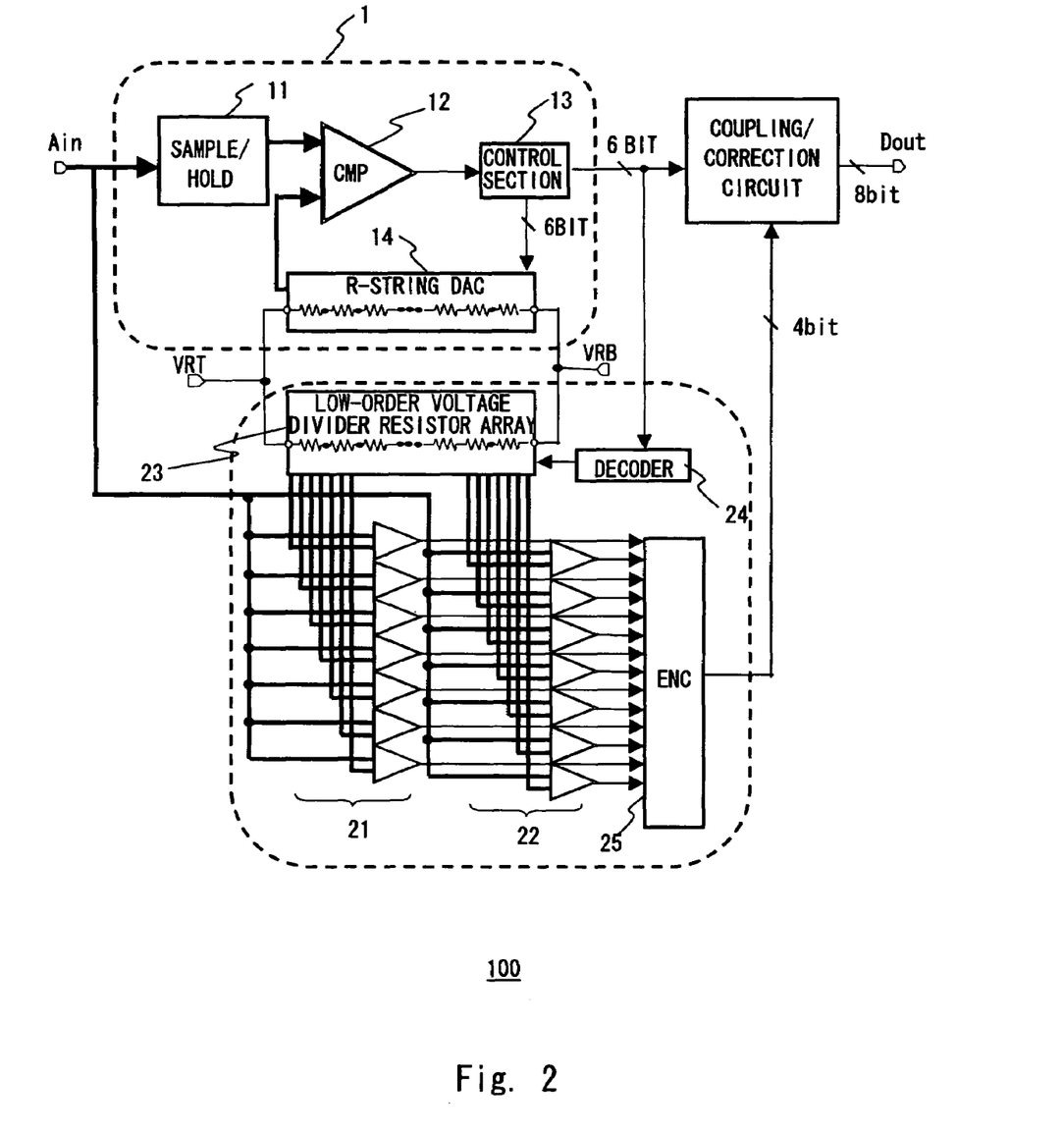
FIG. 2 is a circuit diagram showing an A/D conversion apparatus of an embodiment.

The configuration of the A/D conversion apparatus 100 of this embodiment is described in further detail below. FIG. 2 is a detailed circuit diagram of the A/D conversion apparatus 100 shown in FIG. 1. The A/D conversion apparatus 100 of this embodiment receives a differential signal. In FIG. 2, the wiring indicated by a heavy line transmits a differential signal. For simplification, FIG. 1 illustrates that the high-order successive approximation A/D converter 1 and the low-order flash A/D converter 2 are supplied with the same clock. Specifically, however, a clock generator (not shown) generates a clock for timing control in accordance with the operation of each of the A/D converters 1 and 2 based on a reference clock and supplies it to each A/D converter.

The high-order successive approximation A/D converter 1 shown in FIG. 2 includes a sample/hold circuit 11, a comparator 12, a control section 13 and a D/A converter 14. The sample/hold circuit 11 samples an analog input signal Ain and holds it. One input terminal of the comparator 12 receives an output voltage from the sample/hold circuit 11 and the other input terminal receives an output from the D/A converter 14. The comparator 12 compares the voltages supplied to the both input terminals and outputs a comparison result. The comparator 12 is typically implemented by an operational amplifier. The control section (logic section) 13 has a successive approximation register, a data latch section and so on, though not shown. The control section 13 supplies high-order 6 bits of digital signal to the coupling/correction circuit 3. Further, the control section 13 supplies to the D/A converter 14 a digital signal for an analog voltage to be generated by the D/A converter in the successive approximation operation. The D/A converter 14 generates an analog voltage based on the digital signal from the control section 13 and supplies it to the comparator 12.

The high-order 6-bit data that is output from the successive approximation A/D converter 1 is then supplied to the low-order flash A/D converter 2 so as to create a low-order reference voltage for low-order bit conversion.

The low-order flash A/D converter 2 includes a first comparison section 21, a second comparison section 22, a low-order voltage dividing resistor array 23, a decoder 24, and an encoder 25.

The first comparison section 21 and the second comparison section 22 have basically the same configuration and they perform interleaving. Each of the first and the second comparison sections 21 and 22 has seven comparators. The first and the second comparison sections 21 and 22 compare an analog input voltage Ain with a voltage divided from a low-order reference voltage and supply a comparison result to the encoder 25. The low-order voltage dividing resistor 23 supplies a low-order reference voltage to the first comparison section 21 or the second comparison section 22. The low-order reference voltage is determined by the decoder 24 based on a conversion result of high-order 6 bits. The encoder 25 generates data corresponding to low-order 2 bits and correction bits (2 bits) from the comparison result supplied from the first or the second comparison section and outputs the data. The following description focuses on the operation of the first comparison section 21.

Figure 3:
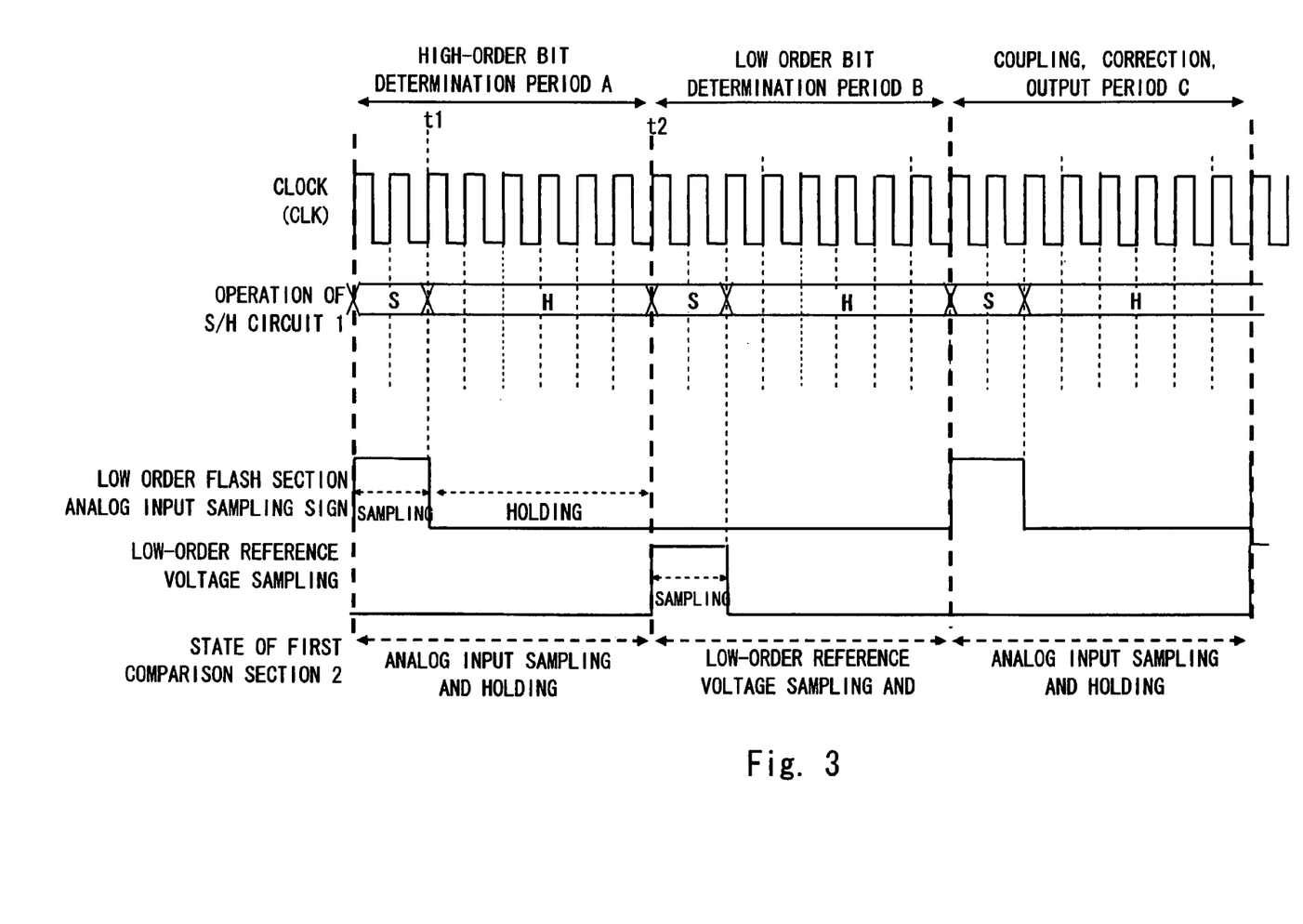
FIG. 3 is a timing chart showing the operation of an A/D conversion apparatus of an embodiment.

FIG. 3 is a timing chart to describe the operation of the A/D conversion apparatus 100 shown in FIG. 2. The operation of the A/D conversion apparatus 100 of this embodiment is described herein with reference to FIG. 3. The following description describes the operation of the A/D conversion apparatus 100 of this embodiment in each of three 8-clock periods A, B and C. The clock of FIG. 3 indicates a clock signal supplied to the high-order successive approximation A/D converter 1.

First, during a first period (high-order bit determination period) A, the sample/hold circuit 11 samples an input analog signal Ain and holds the sampled voltage for a predetermined period. In this embodiment, the sample/hold circuit 11 performs sampling during a period corresponding to two clock cycles and then holds the sampled voltage for the rest of the first period A (six clock cycles) as shown in FIG. 3.

The high-order successive approximation A/D converter 1 starts the successive approximation operation at the third clock cycle of the supplied clock CLK (t1 in FIG. 3). The high-order successive approximation A/D converter 1 repeats the successive approximation operation six times from the third clock cycle to the eighth clock cycle of the first period A, thereby determining high-order 6 bits.

In the first period A, the first comparison section 21 of the low-order flash A/D converter 2 samples the analog input voltage Ain during the same period as the sampling period of the high-order successive approximation A/D converter 1. The sampled analog input voltage is stored in a sampling capacitor of the first comparison section 21.

Upon ending the first period A (t2 in FIG. 3), the high-order successive approximation A/D converter 1 supplies the determined high-order 6 bits to the low-order flash A/D converter 2. In the low-order flash A/D converter 2, the decoder 24 determines to which resistor of the low-order voltage dividing resistor array the comparison section 21 or 22 is to be connected based on the high-order 6 bits.

In a second period (low-order bit determination period) B, the low-order flash A/D converter 2 samples a low-order reference voltage. The sampling is performed during two clock cycles as shown in FIG. 3. After that, the seven comparators of the first comparison section 21 compare the analog input voltage Ain that is held in the first period A with each node of the low-order voltage dividing resistor array 23. Though it is normally sufficient that the first comparison section 21 has three comparators to determine low-order 2 bits, this embodiment uses seven comparators for comparison in order to generate correction bits as well.

Figure 4:
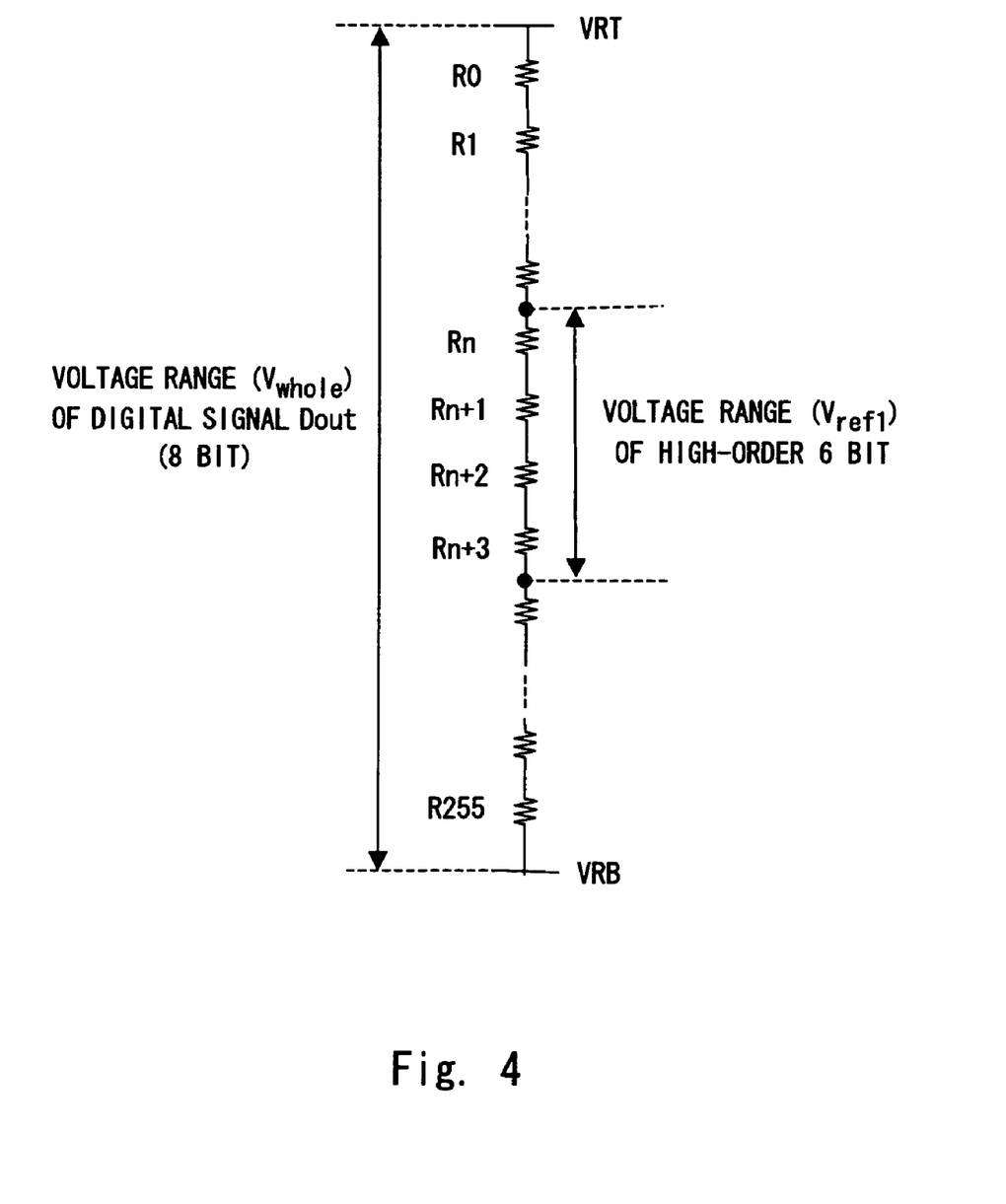
FIG. 4 is a view showing a voltage range of high order 6 bits.
Figure 5:
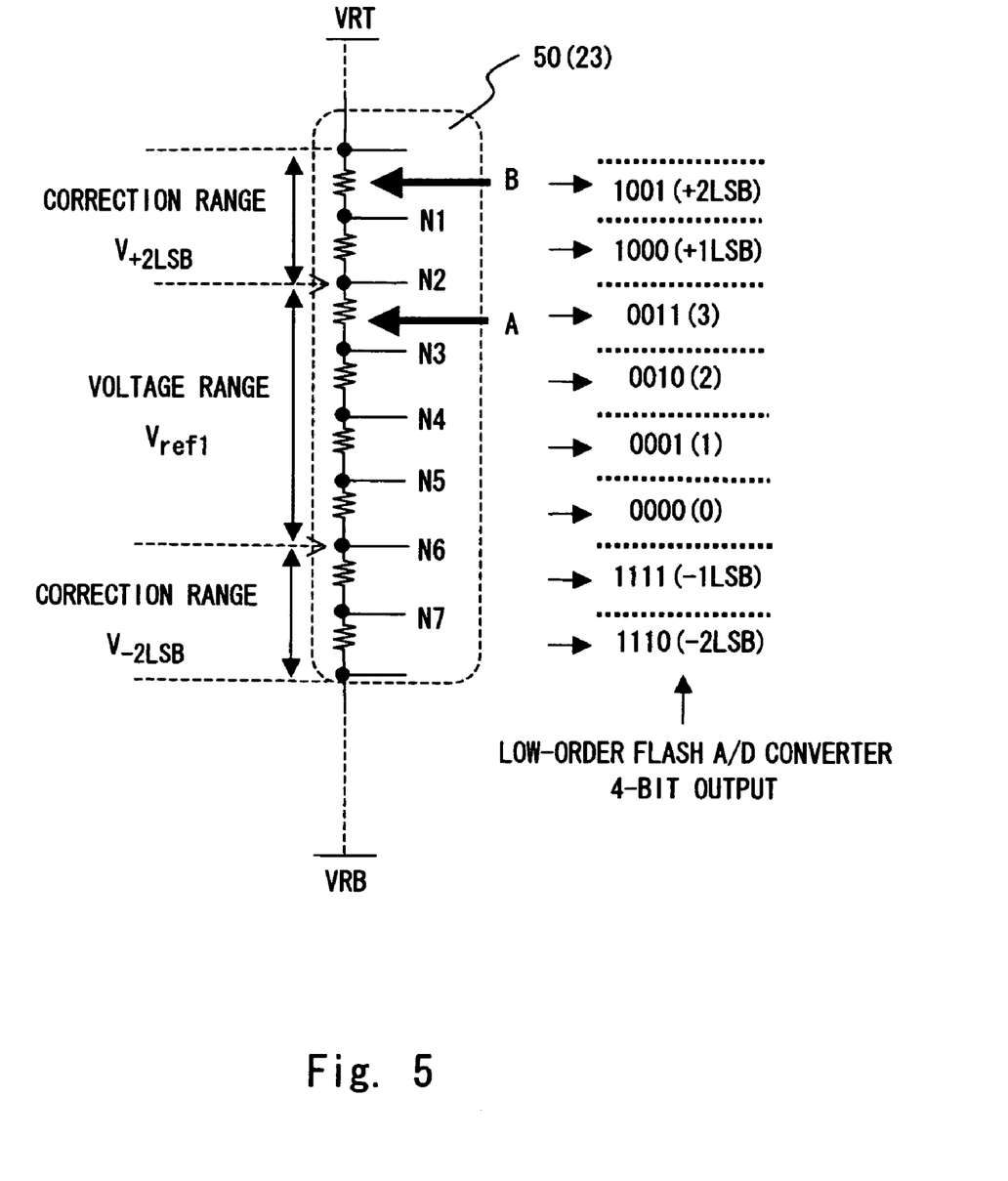
FIG. 5 is a view showing the relationship between a correctable range and output data.

FIGS. 4 and 5 are views showing the relationship of a voltage range, a voltage dividing resistor and output data so as to describe the correction operation. Creation of correction bits is described herein with reference to FIGS. 4 and 5.

The voltage values represented by an 8-bit digital signal Dout are 256 levels. The 256-level voltage between VRT and VRB of FIG. 2 is refereed to as Vwhole. If high-order 6 bits are determined, a voltage range of successive 4 levels of the 256-level voltage is determined. This is referred to as Vref1. In order to describe the voltage range Vref 1, if the voltage Vwhole is divided by resistors connected in series, the voltage is narrowed down to the range of four resistors by the high-order 6 bits. FIG. 4 illustrates this state. If no error exists in the high-order 6 bits, a low-order reference voltage to be applied to the low-order flash A/D converter 2 can be generated based on the voltage between both ends of the four resistors. Thus, if the high-order 6 bits have no error, it is possible to generate low-order 2 bits by determining which one of the four resistors receives a voltage of analog input. In case the voltage range Vref1 selected by the high-order 6 bits is displaced, this embodiment creates correction bits by adding four comparators, two for high-order and two for low-order of the three comparators required for outputting low-order 2 bits.

FIG. 5 shows the voltage range Vref1 selected by high-order 6 bits and correctable voltage ranges that are 2 LSB higher and lower than Vref1 (V+2 LSB, V−2 LSB), and an example of data output containing correction bits. In FIG. 5, a resistor array 50 may be the low-order voltage dividing resistor array 23, for example. The low-order voltage dividing resistor array 23 includes eight resistors and a divided voltage is acquired from a node N1 to N7 between each adjacent resistors. The voltages at the nodes N1 to N7 are respectively input to seven comparators of the first comparison section 21.

If the voltage range selected by high-order 6 bits is correct, an analog input voltage is supposed to fall within the voltage range Vref1 selected by the high-order 6 bits. The analog input voltage in this case is indicated by the arrow A in FIG. 5. When the analog input voltage indicated by the arrow A is applied, the comparators connected to one of the nodes N3 to N7 output "H" while the comparators connected to the node N1 or N2 output "L", for example. Receiving the outputs of the comparators, the encoder 25 generates "00" as correction bits and "11" as low-order 2 bits of a comparison result. As a result, the low-order flash A/D converter 2 outputs 4-bit data "0011".

On the other hand, if the voltage range selected by high-order 6 bits is displaced for some reasons, an analog input voltage does not fall within this range. The analog input voltage in such a case is indicated by the arrow B in FIG. 5. It shows a case where the voltage range selected by high-order 6 bits is displaced downward. In this case, the comparators connected to the node N1 to N7 all output "H". Receiving the outputs of the comparators, the encoder 25 generates "10" as correction bits and "01" as low-order 2 bits of a comparison result. As a result, the low-order flash A/D converter 2 outputs 4-bit data "1001" as shown in FIG. 5. Similarly, in a case where the voltage range selected by high-order 6 bits is displaced upward, a combination of correction bits "11" and low-order 2 bits as shown in FIG. 5 is output.

In sum, the low-order flash A/D converter 2 of this embodiment uses seven comparators to output correction bits that allows +2 LSB or −2 LSB voltage correction together with low-order 2 bits.

As described above, during the second period B, the low-order flash A/D converter 2 outputs correction bits and low-order 2 bits.

After the low-order 2 bits are determined, coupling of the high-order 6 bits with the low-order 2 bits and correction of data are performed during the third period C. The coupling/correction circuit 3 couples the high-order 6 bits that are determined in the first period A and held by a latch circuit or the like (not shown) and the low-order 2 bits that are determined in the second period B. At this time, correction of the high-order 6 bits is performed according to the correction bits "10", "11" or "00". Though no correction is made for the high-order 6 bits when the correction bits are "00", correction is made when the correction bits are "10" or "11". For example, if the correction bits are "10", "000001" is added to the high-order 6 bits. If the correction bit is "11", "000001" is subtracted from the high-order 6 bits.

Figure 6:
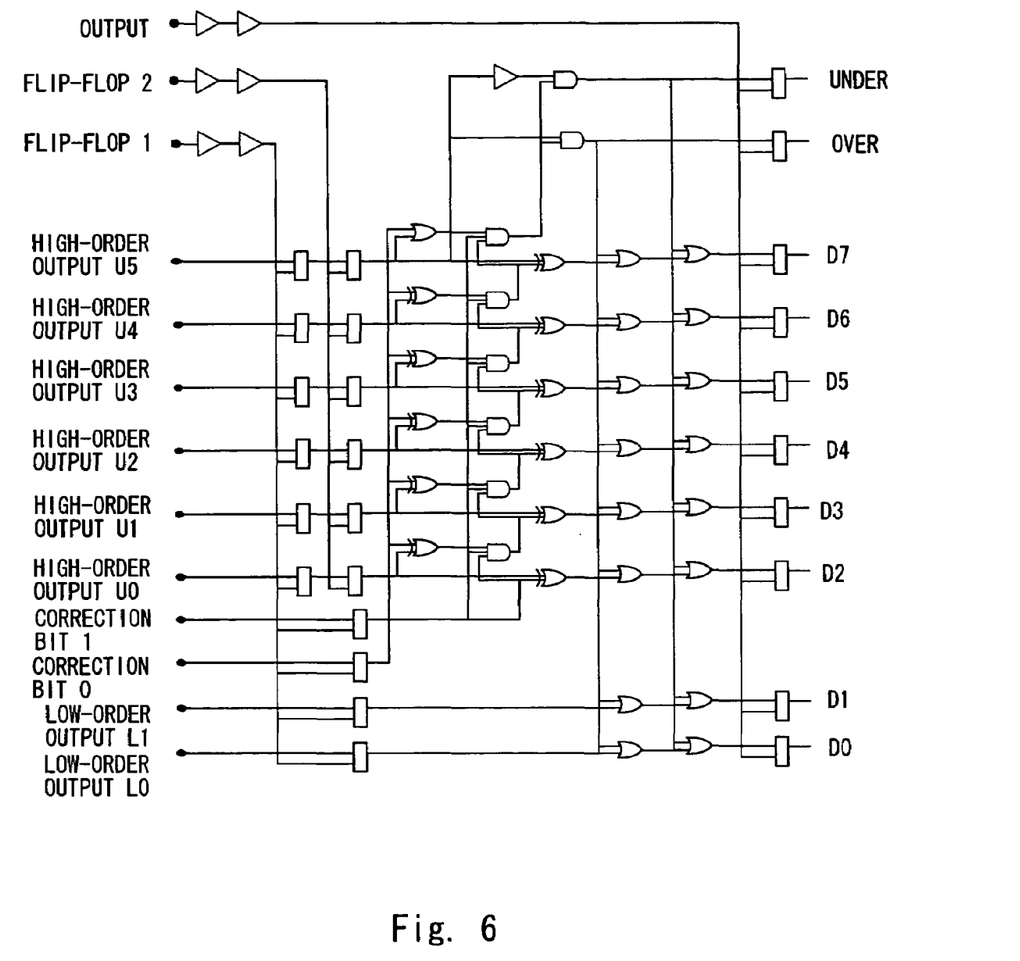
FIG. 6 is a circuit diagram showing a coupling/correction circuit.

FIG. 6 shows a logic circuit to perform coupling of high-order bits with low-order bits and correction. The relationship between the correction bits and the logical operation is not limited to the one shown in FIG. 6 as long as high-order 6 bits can be corrected by correction bits. Therefore, the coupling/correction circuit is not restricted to the circuit of FIG. 6 but may be altered in combinations of various logic elements. A digital signal after coupling of high-order and low-order bits and correction is output as digital output Dout from the A/D conversion apparatus 100.

As described above, the A/D conversion apparatus 100 of this embodiment converts the analog signal Ain into the digital signal Dout by the operations from the first to third periods.

As mentioned earlier, the low-order flash A/D converter 2 of this embodiment performs interleaving. Therefore, after the high-order successive approximation A/D converter 1 converts high-order 6 bits and stores them into a latch circuit or the like in the first period A, the process proceeds to sampling and conversion of a next analog input signal Ain in the second period B. In the second period B, the second comparison section 22 of the low-order flash A/D converter 2 samples and holds the analog input voltage. Then, in the third period C, the second comparison section 22 converts the low-order 2 bits of the analog input voltage sampled during the second period B. After that, in the period following the third period C, the process couples high-order bits with low-order bits and outputs it. While the second comparison section 22 of the low-order flash A/D converter 2 performs conversion during the third period C, the first comparison section 21 performs sampling and holding again. Though this embodiment implements interleaving where the first comparison section and the second comparison section operate alternately, it is feasible to use one comparison section by placing a plurality of sample/hold circuits in the low-order flash A/D converter 2.

This embodiment significantly reduces the number of comparators compared to the case of creating high-order bits in a flash A/D converter. Further, it is sufficient for the high-order successive approximation A/D converter to compare voltages of 1st to 6th bits only, which prevents power consumption from increasing due to a complicated configuration such as multistage amplification.

The relationship between a degree of amplification required for the A/D conversion apparatus 100 of this embodiment and a consumption current is described below. In the A/D conversion apparatus 100 of this embodiment, it is necessary for the high-order successive approximation A/D converter 1 to detect differential voltages of the most significant bit to the 6th bit and give an output whose logic value can be determined by the control section (logic section) 13 in a subsequent stage. Thus, a gain required for an amplifier used in the comparator 12 is calculated by the following formula:

$$\text{Gain}=20 \log_{10}(2^m)-6(\text{dB})$$

where m is the number of bits that are converted by the high-order successive approximation A/D converter 1. Since it is high-order 6 bits in this embodiment, a required amplification degree is 30.12 dB. On the other hand, in a case of using an all-bit successive approximation A/D converter, it is necessary to detect a differential voltage of ⅛ of a LSB voltage and give an output whose logic value can be determined by the control section (logic section) 13 in a subsequent stage. Thus, a gain in this case is calculated by the following formula:

$$\text{Gain}=20 \log_{10}(2^m*8)-6(\text{dB})$$

Since m=8 in this case, a required amplification degree is 60.22 dB. Generally, a comparator that provides high gain (60 to 70 dB) requires multistage amplifier for higher amplification degree. The multistage amplifier causes higher consumption current according to the number of stages. On the other hand, a comparator that provides low gain (30 to 40 dB) allows use of a comparator with a single-stage amplifier. Thus, this embodiment can form the comparator 12 of the high-order successive approximation A/D converter 1 with a single-stage amplifier.

In other words, the A/D conversion apparatus 100 of this embodiment employs a successive approximation A/D converter for high-order A/D conversion. It uses this high-order successive approximation A/D converter to convert the number of high-order bits that does not require a complicated multistage configuration. Therefore, a consumption current of the comparator is about ½ of that when using all-bit successive approximation A/D converter. In this embodiment, the comparator 12 is implemented by a single-stage amplifier and the consumption current is about 500 μA.

Figure 7:
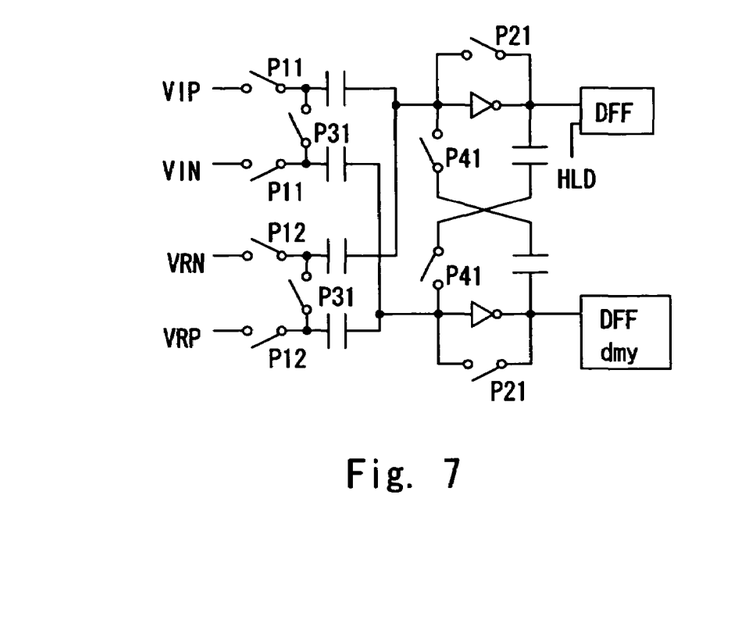
FIG. 7 is a circuit diagram showing a comparator used for a low-order flash A/D converter of an embodiment.

Further, the low-order flash A/D converter 2, which includes the first and the second comparison sections, has total 14 comparators. The comparators used in the low-order flash A/D converter 2 are chopper comparators having the configuration shown in FIG. 7. The detailed operation of the chopper comparator is disclosed in Japanese Unexamined Patent Publication No. 2002-374153 and thus not described here.

Since the consumption current of one chopper comparator is 15 μA, the consumption current of the whole A/D conversion apparatus 100 of this embodiment is 500+14*15=710 μA.

On the other hand, in a case of using a flash A/D converter for A/D conversion that splits data into high-order 5 bits and low-order 3 bits, total 57 comparators are required for high-order and low-order A/D converters. When using the same chopper comparator as in FIG. 7, the consumption current of the A/D converter of FIG. 8 is 57*15=855 μA As described in the foregoing, the A/D conversion apparatus 100 of this embodiment can reduce power consumption compared to the case of using an all-bit successive approximation A/D converter or using a flash A/D converter to convert both high-order and low-order bits. Further, the A/D conversion apparatus 100 of this embodiment employs a successive approximation A/D converter for high-order A/D conversion and uses it to convert the number of high-order bits that does not require a complicated multistage configuration. If an amplification section of a comparator used for a successive approximation A/D converter has multistage configuration, a consumption current increases according to the number stages. However, since this embodiment uses the high-order successive approximation A/D converter to convert only the number of high-order bits that does not require a complicated multistage configuration, it is possible to prevent an increase in consumption current due to the successive approximation A/D converter.

The effect of this embodiment to reduce power consumption varies according to the conversion frequency of the A/D conversion apparatus 100. The effect is significant if the conversion frequency is several hundreds of kHz to 4 MHz and it is possible to reduce the power consumption of the A/D conversion apparatus 100 effectively.

Though a preferred embodiment of the present invention is described in detail in the foregoing, the present invention is not restricted to the above-mentioned embodiment but various changes may be made. As described in the above embodiment, the low-order flash A/D converter 2 is not limited to the A/D converter that performs interleaving but may be the one that converts low-order bits by switching two or more sample/hold circuits. Further, the correction bit is not limited to the format of the above embodiment and the logic circuit is not limited to that shown in FIG. 6. It is feasible to place a separate logic circuit from a coupling circuit as long as it can perform logic operation for correcting high-order bits.

It is apparent that the present invention is not limited to the above embodiment, that may be modified and changed without departing from the scope and spirit of the invention.

What is claimed is:

1. An A/D conversion apparatus for converting an analog signal into a digital signal, comprising:
   a successive approximation A/D converter receiving the analog signal and outputting high-order data of the digital signal;
   a flash A/D converter receiving the analog signal and outputting low-order data of the digital signal; and
   a coupling circuit coupling the high-order data and the low-order data and outputting the digital signal.

2. The A/D conversion apparatus of claim 1, wherein the flash A/D converter outputs a correction bit for correcting the high-order data together with the low-order data.

3. The A/D conversion apparatus of claim 2, further comprising a correction circuit correcting the high-order data based on the correction bit.

4. The conversion apparatus of claim 1, wherein the flash A/D converter comprises:
   a voltage dividing resistor including a plurality of resistors connected in series and receiving a reference voltage; and
   a plurality of comparators comparing a divided fraction of the reference voltage divided by the voltage dividing resistor with the analog signal, wherein the reference voltage is determined based on the high-order data.

5. The A/D conversion apparatus of claim 2, wherein the flash A/D converter comprises:
   a voltage dividing resistor including a plurality of resistors connected in series and receiving a reference voltage; and
   a plurality of comparators comparing a divided fraction of the reference voltage divided by the voltage dividing resistor with the analog signal,
   wherein the reference voltage is determined based on the high-order data.

6. The A/D conversion apparatus of claim 3, wherein the flash A/D converter comprises:
   a voltage dividing resistor including a plurality of resistors connected in series and receiving a reference voltage; and
   a plurality of comparators comparing a divided fraction of the reference voltage divided by the voltage dividing resistor with the analog signal,
   wherein the reference voltage is determined based on the high-order data.

7. The A/D conversion apparatus of claim 4, wherein the flash A/D converter creates the correction bit based on a comparison result of the plurality of comparators.

8. The A/D conversion apparatus of claim 1, wherein the successive approximation A/D converter includes a comparator implemented by a single-stage amplifier.

9. The A/D conversion apparatus of claim 2, wherein the successive approximation A/D converter includes a comparator implemented by a single-stage amplifier.

10. The A/D conversion apparatus of claim 3, wherein the successive approximation A/D converter includes a comparator implemented by a single-stage amplifier.

11. The A/D conversion apparatus of claim 4, wherein the successive approximation A/D converter includes a comparator implemented by a single-stage amplifier.

12. An A/D conversion method comprising:
   generating high-order data as a result of converting an input analog signal into a digital signal of a first predetermined number of bits by performing successive approximation a plurality of times;
   generating low-order data as a result of converting the input analog signal into a digital signal of a second predetermined number of bits by comparing in parallel the analog signal with a reference voltage set based on the high-order data; and
   converting the input analog signal into a digital output signal by coupling the high-order data and the low-order data.

13. The A/D conversion method of claim 12, wherein generating low-order data further comprises outputting a correction bit for correcting the high-order data together with the low-order data.

14. An A/D conversion apparatus for converting an analog signal into a digital signal, comprising:
   means for successive approximation A/D conversion receiving the analog signal and outputting high-order data of the digital signal;
   means for flash A/D conversion receiving the analog signal and outputting low-order data of the digital signal; and
   means for coupling the high-order data and the low-order data and outputting the digital signal.

15. The A/D conversion apparatus of claim 14, wherein the means for flash A/D conversion outputs a correction bit for correcting the high-order data together with the low-order data.

16. The A/D conversion apparatus of claim 15, further comprising means for correcting the high-order data based on the correction bit.

17. The conversion apparatus of claim 14, wherein the means for flash A/D conversion comprises:
   means for voltage dividing receiving a reference voltage; and
   a plurality of means for comparing a divided fraction of the reference voltage divided by the means for voltage dividing with the analog signal, wherein the reference voltage is determined based on the high-order data.

18. The A/D conversion apparatus of claim 15, wherein the means for flash A/D conversion comprises:
   a means for voltage dividing receiving a reference voltage; and
   a plurality of means for comparing a divided fraction of the reference voltage divided by the means for voltage dividing with the analog signal, wherein the reference voltage is determined based on the high-order data.

19. The A/D conversion apparatus of claim 16, wherein the means for flash A/D conversion comprises:
  means for voltage dividing receiving a reference voltage; and
  a plurality of means for comparing a divided fraction of the reference voltage divided by the means for voltage dividing with the analog signal,
  wherein the reference voltage is determined based on the high-order data.

20. The A/D conversion apparatus of claim 17, wherein the means for flash A/D conversion creates the correction bit based on a comparison result of the plurality of means for comparing.

* * * * *